United States Patent [19]

Mizukami et al.

[11] Patent Number: 4,753,852

[45] Date of Patent: Jun. 28, 1988

[54] MAGNETIC RECORDING MEDIUM COMPRISING A MAGNETIC CO-NI-CR ALLOY THIN LAYER

[75] Inventors: Makoto Mizukami, Yokohama; Toshio Kato, Yamato; Toshikazu Nishihara, Zama; Toshiro Abe, Tokyo; Akihiro Kimura, Sagamihara, all of Japan

[73] Assignee: Victor Company of Japan, Ltd., Japan

[21] Appl. No.: 842,647

[22] Filed: Mar. 21, 1986

[30] Foreign Application Priority Data

Mar. 23, 1985 [JP] Japan .................. 60-59191

[51] Int. Cl.⁴ .......................... B32B 15/10
[52] U.S. Cl. .................. 428/651; 428/626; 428/630; 428/634; 428/652; 428/668; 428/928
[58] Field of Search .......... 360/134, 135, 136; 428/607, 611, 928, 651, 652, 667, 626, 630, 634, 641, 668

[56] References Cited

U.S. PATENT DOCUMENTS

| | | | |
|---|---|---|---|
| 4,074,016 | 2/1978 | Trippel | 428/626 |
| 4,079,169 | 3/1978 | Nigh et al. | 428/636 |
| 4,236,946 | 12/1980 | Aboaf et al. | 148/108 |
| 4,245,008 | 1/1981 | Michaelsen et al. | 428/611 |
| 4,277,540 | 7/1981 | Aine | 428/627 |
| 4,426,265 | 1/1984 | Brunsch et al. | 204/192 M |
| 4,548,871 | 10/1985 | Kobayashi et al. | 428/593 |
| 4,552,820 | 11/1985 | Lin et al. | 428/611 |
| 4,582,746 | 4/1986 | Shirahata et al. | 428/216 |
| 4,594,296 | 6/1986 | Noguchi et al. | 428/610 |
| 4,599,280 | 7/1986 | Izumi et al. | 360/136 |

FOREIGN PATENT DOCUMENTS 57-109127  7/1982  Japan .

Primary Examiner—John P. Sheehan
Attorney, Agent, or Firm—Lowe, Price, Leblanc, Becker & Shur

[57] ABSTRACT

A magnetic recording medium for high density recording comprising a non-magnetic substrate, a Cr undercoat and a magnetic Ni-Cr-Co alloy thin layer formed on the substrate. The magnetic alloy thin layer has a thickness of from 400 to 1200 angstrom and a Cr content of from 3 to 17 atomic percent. As a result, improved magnetic characteristics and corrosion resistance of the medium are ensured.

5 Claims, 2 Drawing Sheets

MAGNETIC RECORDING MEDIUM COMPRISING A MAGNETIC CO-NI-CR ALLOY THIN LAYER

BACKGROUND OF THE INVENTION

1. Field of the Invention

This invention relates to high density magnetic recording mediums comprising a metallic thin recording layer.

2. Description of the Prior Art

For high density recording, it is essential that magnetic recording mediums have a high coercive force. Known magnetic recording mediums of the type which comprise a metallic thin recording layer are generally made by a procedure of providing a substrate and subjecting the substrate to a physical vapor deposition such as sputtering, thereby forming a metallic thin layer directly on the substrate. However, this type of magnetic recording medium has been found to be disadvantageous with respect to coercive force, modulation noise, corrosion resistance and the like characteristic properties. This is unsatisfactory for high density recording.

SUMMARY OF THE INVENTION

It is therefore an object of the present invention to provide a magnetic recording medium having a metallic thin recording layer which has a high coercive force and a high signal-to-noise ratio.

It is another object of the invention to provide a magnetic recording layer which comprises a Cr undercoat on which a Co-Ni-Cr alloy thin layer is formed whereby magnetic characteristics are improved with an improved corrosion resistance of the alloy layer.

The above objects can be achieved, according to the invention, by a magnetic recording medium which comprises a non-magnetic support, a Cr undercoat formed on the support, and a magnetic thin layer of a Co-Ni-Cr alloy formed on the Cr undercoat in a thickness of from 400 to 2000 angstrom, the alloy having from 3 to 17 atomic percent of Cr.

DETAILED DESCRIPTION AND EMBODIMENTS OF THE INVENTION

Figure 2:
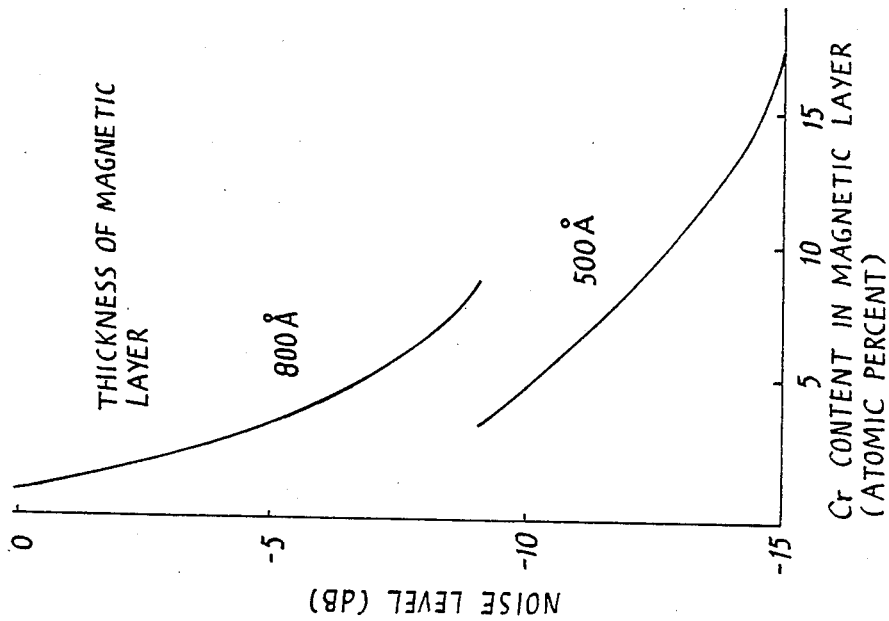
FIG. 2 is a graphical representation of the noise level in relation to the content of Cr in a Co-Ni-Cr alloy for a magnetic thin layer for different layer thicknesses.

The magnetic recording medium of the invention comprises a non-magnetic substrate, and a Cr undercoat and a Co-Ni-Cr alloy thin layer formed on the substrate in this order. The present invention is characterized by the formation of the Cr undercoat between the non-magnetic substrate and the Co-Ni-Cr alloy layer. We have found that when a Cr undercoat is formed on the substrate and then the Co-Ni-Cr alloy thin layer is formed on the undercoat layer, the magnetic characteristics of the alloy layer are improved over those characteristics of a magnetic recording medium which is free of the Cr undercoat provided that the alloy layer has a defined range of thickness and a defined range of Cr content in the alloy. Presumably, this is because the Co-Ni-Cr alloy layer formed on the Cr undercoat layer tends to be highly oriented in the in-plane direction. In other words, if the Cr layer is absent, the degree of orientation in the in-plane direction becomes poor.

The Cr undercoat or layer is deposited on the substrate generally in a thickness range of from 1000 angstrom to 1 micrometer, preferably from 2000 to 5000 angstrom.

On the Cr layer is formed a Co-Ni-Cr alloy layer in a thickness of from 400 to 2000 angstrom for the reason discussed hereinafter. The alloy should have a Cr content of from 3 to 17 atomic percent in order to attain the purposes of the present invention. With less Cr content, the coercive force and corrosion resistance tend to lower and a noise level cannot satisfactorily be suppressed. On the contrary, when the Cr content is larger, the coercive force starts to lower. Accordingly, the content of the Cr is in the range of from 3 to 17 atomic percent, preferably 5 to 15 atomic percent. The reason why the magnetic characteristics and corrosion resistance are improved by the addition of Cr to Ni-Co alloys is considered as follows. When Cr is added, constituent grains of the magnetic layer formed, for example, by physical vapor deposition become finer and the magnetic anisotropy is improved, resulting in an improvement of the coercive force. The noise level is considered to lower because the magnetization process comes close to magnetization rotation. Cr on the surface of the layer is partially converted into $Cr_2O_3$ on exposure to air after the deposition and thus the corrosion resistance is improved.

It has been found that the above tendencies become more pronounced when the thickness of the alloy layer is properly controlled. As the thickness increases, the coercive force tends to lower with a tendency of the noise level to increase. In this sense, it is desirable that the magnetic alloy layer not be too thick, but if the layer thickness is too small, the corrosion resistance lowers with a lowering of output power. Accordingly, the thickness is determined to be in the range of from 400 to 2000 angstrom.

The content of Ni and Co do not influence the magnetic characteristics so much as compared with the content of Cr and are preferably determined such that Ni is contained in an amount not larger than 30 atomic percent.

The non-magnetic substrate used in the present invention is made, for example, of non-magnetic metals such as Al, Cu and the like. Ceramics, glasses and synthetic resins such as polyethyleneimide, polyethylene sulfide and polyether sulfone and the like may also be used. Of these, Al is preferably used. The substrate may take any form such as a disc, a card, a tape, and the like. If non-magnetic metals are used as the substrate, it is favorable that the metal substrate is plated, such as with Ni-P in order to improve the surface properties of the substrate. Where ceramics, glasses or synthetic resins are used as the substrate, the substrate may be similarly plated on the surface thereof as is known in the art.

The Cr undercoat and the alloy layer are formed on the substrate by any known vacuum deposition techniques including sputtering, vacuum evaporation, and the like under conditions well known in the art and these techniques are not described in detail here, but a specific manner of deposition is particularly described in the following examples.

EXAMPLE 1

An Ni-P plated aluminum disk substrate was placed in a DC magnetron sputtering apparatus and a Cr target having a diameter of 8 inches were sujected to the magnetron sputtering under conditions of a pressure of 5 mTorr., in an atmosphere of Ar to form an about 2500 angstrom thick Cr layer on the Ni-P plated substrate.

Thereafter, a Co target having a diameter of 8 inches on which a 7×7 mm Ni chip and a 7×7 mm Cr chip were arranged was subjected to magnetron sputtering under conditions of 5 mTorr., in an atmosphere of Ar to form a magnetic thin film of Co-Ni-Cr magnetic alloy on the Cr layer. This procedure was repeated using different types of Co-Ni-Cr alloys in which the contents of Co and Cr were changed with a constant content of Ni, i.e. $Co_y Ni_{18} Cr_x$ wherein $x+y+18=100$, thereby obtaining magnetic recording disks having different layer thicknesses and different contents of Co and Cr in the magnetic layer.

EXAMPLE 2

The general procedure of Example 1 was repeated using the conditions of 8 mTorr., at the time when the Co-Ni-Cr alloy thin layer was formed, thereby form a $Co_{73} Ni_{18} Cr_9$ magnetic thin layer on the Cr layer in different thicknesses, thereby obtaining magnetic disks.

Figure 1:
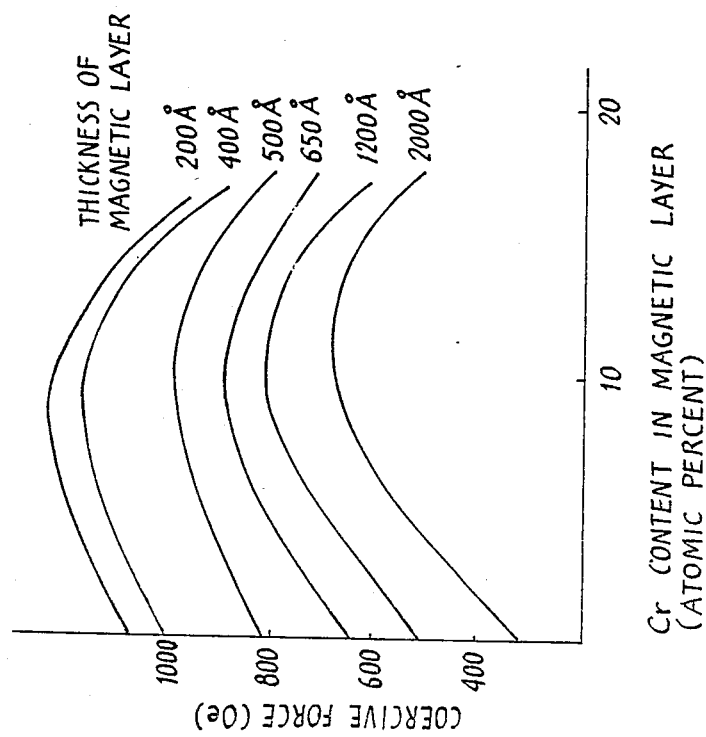
FIG. 1 is a graphical representation of coercive force in relation to the content of Cr in a Co-Ni-Cr alloy for a magnetic thin layer for different layer thicknesses.

The magnetic disks obtained in Example 1 were subjected to measurement of a coercive force, Hc, with the results shown in FIG. 1.

The results reveal that the coercive force is largely influenced by the content of Cr in the magnetic alloy thin layer. More particularly, the coercive force of the alloys containing Cr is higher than the coercive force of the Cr-free alloy. The peak of the coercive force will be found to be in the range of about 7 to 13 atomic percent with respect to the content of Cr, irrespective of the layer thickness. Moreover, the coercive force becomes higher when the layer thickness is smaller. From the figure, it has been determined that the magnetic thin layer is satisfactory with respect to the coercive force when the Cr content in the layer is in the range of from 3 to 17 atomic percent, preferably from 7 to 13 atomic percent and the thickness is not larger than about 2000 angstrom.

The disks of Example 1 were also subjected to measurement of a noise level for different thicknesses of 800 angstrom and 500 angstrom by a noise spectrum method. The results are shown in FIG. 2, revealing that when the content of Cr in the magnetic thin layer increases, the noise level decreases. In addition, the decrease of the thickness results in a lowering of the noise level. The noise level is low when the content of Cr in the magnetic layer is not less than 3 atomic percent.

Figure 3:
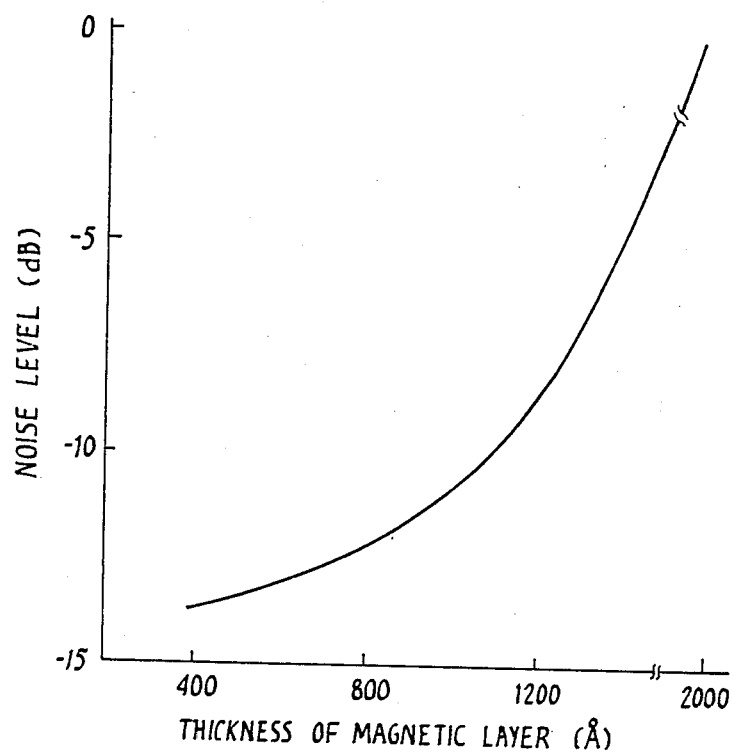
FIG. 3 is a graphical representation of the noise level in relation to the variation in thickness of a magnetic layer.

The magnetic disks obtained in Example 2 were also subjected to measurement of the noise level. The results are shown in FIG. 3, from which it will be seen that the decrease in thickness of the magnetic alloy layer results in a lowering of the noise level. The noise level will be found to be low when the thickness of the layer is not larger than 2000 angstrom.

The magnetic disks obtained in Example 1 were also subjected to a corrosion resistance test in which each disk was allowed to stand under conditions of 60° C. and 80% R.H. for 120 hours. The test results are shown in the Table below.

TABLE

| Content of Cr | Layer Thickeness (angstrom) | | | |
|---|---|---|---|---|
| (atomic percent) | 200 | 400 | 800 | 2000 |
| 0 | x | x | x | x |
| 1 | x | x | x | x |
| 3 | x | o | o | o |
| 6 | Δ | o | o | o |
| 9 | o | o | o | o |
| 12 | o | o | o | o |
| 17 | o | o | o | o |

Note:
x = rusted,
Δ = slightly rusted,
o = not rusted

According to the above results, the corrosion resistance is good when the thickness of the magnetic alloy layer is in the range of from 400 to 2000 angstrom and the content of Cr in the alloy is in the range of from 3 to 17 atomic percent.

What is claimed is:

1. A magnetic recording medium which comprises a non-magnetic support, a Cr undercoat having a thickness of from 1000 angstrom to 1 micrometer formed on said support, and a magnetic thin layer of a Co-Ni-Cr alloy formed on said Cr undercoat in a thickness of from 400 to 2000 angstrom, said alloy having from 3 to 17 atomic percent of Cr and not more than 30 atomic percent of Ni.

2. A magnetic recording medium according to claim 1, wherein said undercoat has a thickness in the range of from 2000 to 5000 angstrom.

3. A magnetic recording medium according to claim 1, wherein said alloy has a Cr content of from 7 to 13 atomic percent.

4. A magnetic recording medium according to claim 1, wherein the content of Cr in said alloy is in the range of from 5 to 15 atomic percent.

5. A magnetic recording medium according to claim 1, wherein said non-magnetic support is made of an aluminum disk plated with Ni-P on the surfaces of the disk.

* * * * *